(12) United States Patent
Machida et al.

(10) Patent No.: US 7,786,580 B2
(45) Date of Patent: Aug. 31, 2010

(54) SEMICONDUCTOR DEVICE AND METHOD FOR MANUFACTURING THE SAME

(75) Inventors: Yoshihiro Machida, Nagano (JP); Takaharu Yamano, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 253 days.

(21) Appl. No.: 11/870,743

(22) Filed: Oct. 11, 2007

(65) Prior Publication Data
US 2009/0001569 A1 Jan. 1, 2009

(30) Foreign Application Priority Data
Oct. 24, 2006 (JP) .............................. 2006-289149

(51) Int. Cl.
*H01L 21/60* (2006.01)

(52) U.S. Cl. .............................. 257/737; 257/E23.068; 438/617

(58) Field of Classification Search ................. 257/737, 257/E23.068
See application file for complete search history.

(56) References Cited

U.S. PATENT DOCUMENTS

| 6,096,577 | A | 8/2000 | Hashimoto | |
|---|---|---|---|---|
| 2001/0013652 | A1* | 8/2001 | Hino et al. | ................... 257/738 |
| 2002/0175409 | A1 | 11/2002 | Tsubosaki | |
| 2004/0115868 | A1 | 6/2004 | Ono | |
| 2004/0159958 | A1 | 8/2004 | Funaki | |

FOREIGN PATENT DOCUMENTS

JP 9-64049 3/1997

\* cited by examiner

*Primary Examiner*—Sue Purvis
*Assistant Examiner*—Krista Soderholm
(74) *Attorney, Agent, or Firm*—Rankin, Hill & Clark LLP

(57) ABSTRACT

A semiconductor chip is characterized by a structure including a semiconductor chip on which electrode pads are formed, bumps which are formed on the respective electrode pads and which have projection sections, an insulating layer formed on the semiconductor chip, and a conductive pattern to be connected to the bumps, wherein extremities of the projection sections are inserted into the conductive pattern and the inserted extremities are flattened.

1 Claim, 8 Drawing Sheets

PARTIALLY-ENLARGED VIEW OF FIG.1

SEMICONDUCTOR DEVICE AND METHOD FOR MANUFACTURING THE SAME

BACKGROUND OF THE INVENTION

The present invention relates to a semiconductor device to which chip-size packaging using bumps is applied, as well as to a method for manufacturing the semiconductor device.

Various types of packaging structures for a semiconductor chip have been put forward. For instance, in association with miniaturization of a package, there has been proposed a structure called a chip-size package in which rewiring (wiring for packaging purpose) is routed on a passivation layer (a protective layer) of a device fabrication plane of a semiconductor chip.

In connection with the chip-size package, there has been put forth; for example, a method for forming a package (a semiconductor device) by means of forming bumps on electrode pads of a semiconductor chip by means of bonding wires and forming a rewiring pattern to be connected to the bumps (see, e.g., Patent Document 1).

[Patent Document 1] JP-A-9-64049

However, under the method described in connection with Patent Document 1 (JP-A-9-64049), when rewiring to be connected to the bumps is formed by means of bonding, there arises a problem of a necessity for adjusting (leveling) the height of the bumps.

For instance, bumps formed by means of bonding wires are formed by use of; e.g., a bonding machine. The bumps are formed by continuously connecting bonding wires from bumps to electrode pads and cutting the bonded bonding wires.

Therefore, the bumps formed by the bonding wires vary in height from a plane where the bumps are formed (i.e., electrode pads). Such variations pose difficulty in forming a rewiring pattern to be connected to the bumps. For this reason, there is needed a step of smoothing bumps by means of exerting a predetermined weight to the bumps.

Smoothing of such bumps is usually performed on a wafer scale (before separation of a chip into pieces by means of dicing). However, in the case of a wafer which has a diameter of 300 mm and which has recently become predominant, when a plurality of bumps formed within a wafer plane are smoothed, there arises a problem of an increase in variations in the height achieved after smoothing.

For instance, when variations in the height of the bumps have increased, variations arise in the state of a connection between the rewiring pattern to be connected to the bumps with the bumps, which in turn raises a problem of deterioration of the reliability of a semiconductor device (a package).

Moreover, under the method described in connection with Patent Document 1 (JP-A-9-64049), an insulating layer is formed so as to cover the bumps. Hence, there has become required a step for abrading the insulating layer in order to make the bumps exposed. In order to form a rewiring pattern after abrasion step, processing for roughening the surface of the insulating layer (so-called desmear processing) is required when an electroless plating technique is used. As a result, processing for forming a plating layer becomes complicated. This in turn adds to the cot for manufacturing a semiconductor device (a package).

Forming a conductive layer by means of sputtering or CVD is also practicable. However, the method requires an expensive film growth apparatus having a vacuum processing container, which also adds to manufacturing cost. Thus, the method is not realistic.

SUMMARY OF THE INVENTION

Accordingly, a centralized challenge to be met by the present invention is to provide a novel, useful semiconductor device which solves the problem, as well as to provide a method for manufacturing the semiconductor device.

A specific challenge to be met by the present invention is to provide a highly-reliable semiconductor device which can be manufactured at low cost and a method for manufacturing the semiconductor device.

From the first viewpoint of the present invention, the above challenge is solved by a method for manufacturing a semiconductor device, including:

a first step of forming bumps having projections on electrode pads which are formed in an area on a substrate corresponding to a semiconductor chip;

a second step of forming an insulating layer and a conductive layer on the substrate;

a third step of pressing the conductive layer, to thus roll extremities of the exposed projections on the conductive layer;

a fourth step of forming a conductive pattern to be connected to the bumps by means of electrolytic plating during which the conductive layer is taken as a feeding layer; and a fifth step of separating the substrate into individual pieces.

From a second viewpoint of the present invention, the above challenge is solved by a semiconductor device including:

a semiconductor chip on which electrode pads are formed;

bumps which are formed on the respective electrode pads and which have projection sections;

an insulating layer formed on the semiconductor chip; and a conductive pattern to be connected to the bumps, wherein extremities of the projection sections are inserted into the conductive pattern, and the inserted extremities are flattened.

The present invention enables provision of a highly-reliable semiconductor device which can be manufactured at low cost and a method for manufacturing the semiconductor device.

DETAILED DESCRIPTION OF THE PREFERRED EMBODIMENTS

Figure 1:
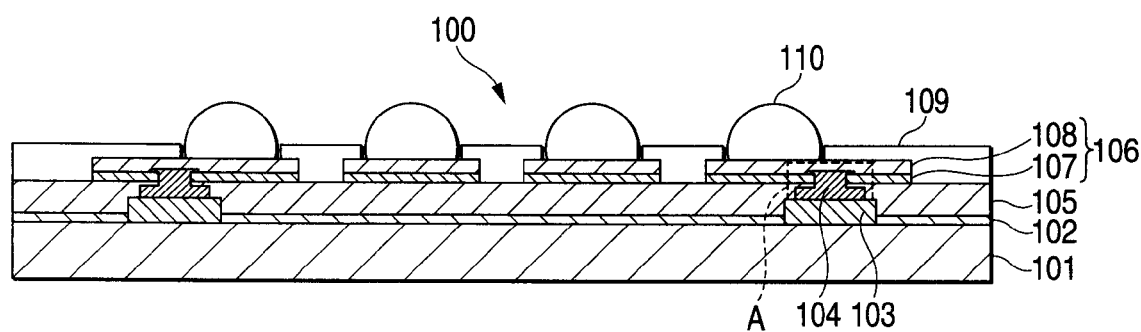
FIG. 1 is a view showing a semiconductor device of a first embodiment.

A method for manufacturing a semiconductor device of the present invention includes a first step of forming bumps having projections on electrode pads formed in an area on a substrate corresponding to a semiconductor chip; a second step of forming an insulating layer and a conductive layer on the substrate; a third step of pressing the conductive layer, to thus roll extremities of the exposed projections on the conductive layer; a fourth step of forming a conductive pattern to be connected to the bumps by means of electrolytic plating during which the conductive layer is taken as a feeding layer; and a fifth step of separating the substrate into individual pieces.

Under the method for manufacturing a semiconductor device, the conductive layer is pressed, and the exposed extremities of the bumps on the conductive layer are rolled. Hence, the extremities are rolled over the conductive layer, and the area of a contact between the bumps and the conductive layer increases, to thus ensure the reliability of a connection between the bumps and a dielectric layer.

According to the method, the extremities of the projections are rolled over the conductive layer, and hence the reliability of an electrical connection between the bumps and the conductive layer becomes less liable to the influence of variations in the height of the bumps (the projections). Therefore, a rewiring pattern exhibiting superior reliability of a connection can be formed under a simple method by use of bumps which are formed through use of; e.g., bonding (bonding wires) and which involve comparatively large variations in height. Moreover, under the above method, the abrasion step for uncovering the projections of the bumps exposed from the insulating layer becomes obviated.

The method is also characterized in that, in the fourth step, forming a conductive pattern on the conductive layer by means of electrolytic plating has become easy by means of taking the conductive layer as a feeding layer. For example, under the electrolytic plating method, a feeding layer (a seed layer) for feeding power to a surface to be plated is required. However, for instance, an electroless plating method or a sputtering method has hitherto been employed as a method for forming such a feeding layer.

However, electroless plating requires processing for roughening the surface of an insulating layer (so-called desmear processing), which makes complicate processing for forming a plating layer. Moreover, the sputtering method requires an expensive film growth apparatus having a vacuum processing container, which adds to manufacturing cost.

In the meantime, the manufacturing method of the present invention is characterized in that desmear processing or sputtering processing performed in a vacuum chamber becomes obviated, thereby enabling easy formation of a seed layer by means of a simple method. Therefore, according to the method, the method for manufacturing a semiconductor device is simplified, and manufacturing cost is eventually reduced.

For instance, in a semiconductor device manufactured by the above manufacturing method, extremities of the projections are inserted into the conductive pattern, and the inserted extremities are rolled, to thus become flat. Thus, the reliability of a connection between the bumps and the conductive pattern becomes superior.

Next, an example structure of the semiconductor device and an example method for manufacturing the semiconductor device will be described hereunder by reference to the drawings.

First Embodiment

FIG. 1 is a cross-sectional view for schematically showing a semiconductor device of a first embodiment of the present invention. By reference to FIG. 1, a semiconductor device 100 of the present embodiment generally has such a structure that an insulating layer 105 and a conductive pattern 106 are formed over a protective layer (a passivation layer) 102 of a semiconductor chip 101 where electrode pads 103 are formed. In this case, there is a case where the conductive pattern 106 is called so-called rewiring and used for packaging the semiconductor chip 101. The insulating layer 105 is formed from; e.g., an epoxy-based resin. The conductive pattern 106 is formed by stacking; for example, a first conductive pattern 107 and a second conductive pattern 108 which are formed from Cu.

The conductive pattern 106 formed over the insulating layer 105 is connected to projections (which will be described later) of bumps 104 formed from; e.g., Au. Specifically, the conductive pattern 106 is connected to a device of the semiconductor chip 101 by way of the bumps 104. The bumps 104 are formed from bonding wires by use of; e.g., a wire bonder.

Solder bumps 110 are formed on the conductive pattern 106. A solder resist layer (an insulating layer) 109 is formed around the solder bumps 110 so as to cover portions of the insulating layer 105 and the conductive pattern 106.

Figure 2:
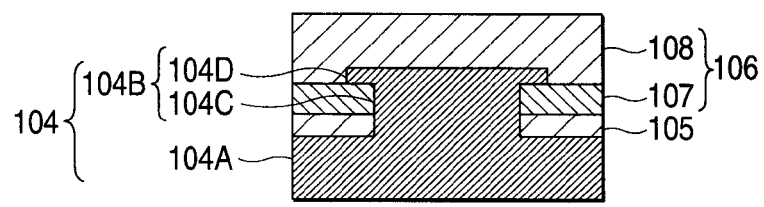
FIG. 2 is a partially-enlarged view of FIG. 1.

FIG. 2 is a schematic cross-sectional view showing section A of the semiconductor device 100 (a neighborhood of the bumps 104) in an enlarged manner. Areas identical with the previously-described areas are assigned the same reference numerals. By reference to FIG. 2, the bump 104 is connected (bonded) to the electrode pad 103; and is formed from an essentially-circular bump main body 104A and a projection section 104B projecting from the bump main body 104A.

For instance, the bump 104 is formed from a bonding wire made of Au, by use of a wire bonder. The wire bonder continuously performs bonding of a bonding wire to the electrode pads 103 and cutting of the bonded bonding wires, whereby the bump main body 104A connected to the bumps 103 and the projection section 104B projecting from the respective bump main bodies 104A are formed.

In the semiconductor device 100 of the present embodiment, the projection section 104B is formed from a flat extremity section 104D provided at the extremity of the projection section 104B and a connection section 104C located between the extremity section 104D and the bump main body 104A. The semiconductor device 100 of the present embodiment is characterized in that the projections 104B are inserted into the conductive pattern 106 and that the inserted extremity sections 104D are rolled into a flat shape.

For instance, the extremity section 104D is rolled between a first conductive pattern 107 and a second conductive pattern 108, which are stacked one on top of the other and which constitute the conductive pattern 106, so as to assume a flat shape. Therefore, a contact area between the bump 104 and the conductive pattern 106 is increased, and an electrical connection between the bumps 104 and the conductive pattern 106 becomes enhanced, and the reliability of the semiconductor device 100 becomes increased. A structure for connecting the bumps 104 to the conductive layer 106 is characterized in that the structure is formed more readily when compared with a related-art connection method, such as brazing, and that the reliability of a connection is high.

Both the first conductive pattern 107 and the second conductive pattern 108 are formed from; e.g., Cu. However, they may also be formed from a material other than Cu. The first conductive pattern 107 and the second conductive pattern 108 may also be formed from different metallic materials (alloy materials), and the conductive pattern 106 may also be realized as a stacked structure made of a different material.

For instance, when the conductive pattern 106 is formed, thin Cu foil is affixed to the insulating layer 105, to thus form a thin conductive layer corresponding to the first conductive pattern 107 among the first conductive pattern 107 and the second conductive pattern 108. Subsequently, the thin Cu foil is pressed, and extremities of the projections 104 uncovered from the Cu foil are rolled. As a result, flat extremity sections 104D are formed, and an electrical connection between the extremity sections 104D and the Cu foil is made superior. Next, the essential requirement is to form a conductive layer corresponding to the second conductive pattern 108 by means of electrolytic plating during which the Cu foil is taken as a feeding layer.

The method for manufacturing the semiconductor device will now be described by reference to FIGS. 3A to 3M and 4A to 4D. In the following drawings, previously-described elements are assigned the same reference numerals, and their repeated explanations are sometimes omitted.

Figure 3A:
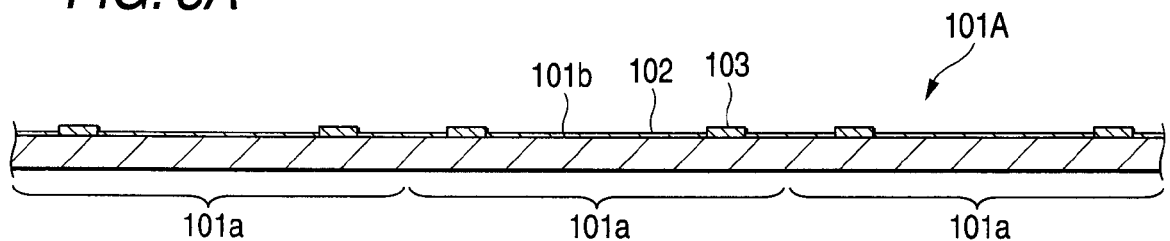
FIG. 3A is a view showing a method for manufacturing the semiconductor device of the first embodiment (part 1)

First, in the step shown in FIG. 3A, a substrate 101A having a plurality of areas 101a (arranged in; for example, a lattice pattern) where devices are fabricated is manufactured by means of a known method. The area 101a is a area corresponding to the semiconductor chip 101. After rewiring (a conductive pattern) has been formed in a step which will be described below, the substrate 101A is sliced by dicing, whereupon semiconductor devices (the semiconductor chips 101) are separated into pieces.

Electrode pads 10 are formed on a device fabrication plane 101b of the area 101a where the device is fabricated. A remaining area of the device fabrication plane 101b other than the electrode pads 103 is protected by a protective layer (a passivation layer) 102 formed from; e.g., SiN ($Si_3N_4$).

Figure 3B:
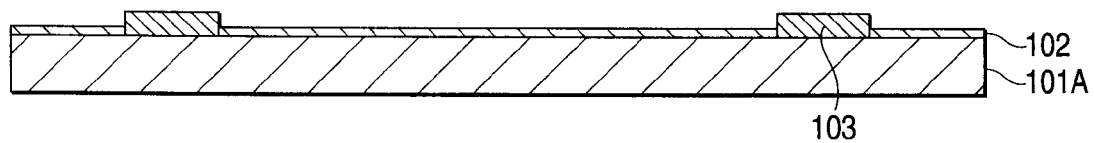
FIG. 3B is a view showing a method for manufacturing the semiconductor device of the first embodiment (part 2)

FIG. 3B is a view showing, in an enlarged manner, one area 101a of the substrate 101A shown in FIG. 3A. In connection with FIG. 4B and subsequent drawings, a method for manufacturing a semiconductor device is described by means of taking, as an example, one area 10a of the substrate 101 where the plurality of areas 101a are formed.

Figure 3C:
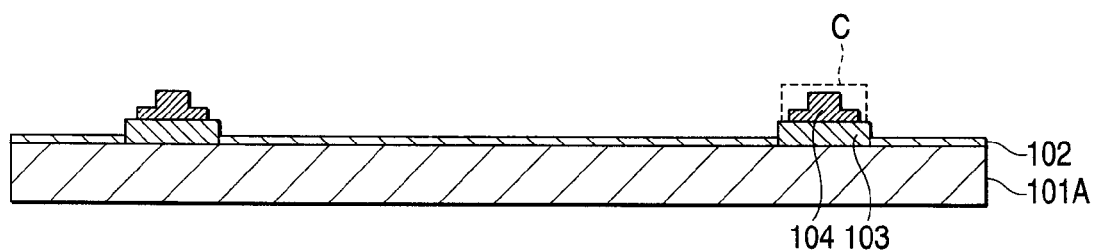
FIG. 3C is a view showing a method for manufacturing the semiconductor device of the first embodiment (part 3)
Figure 4A:
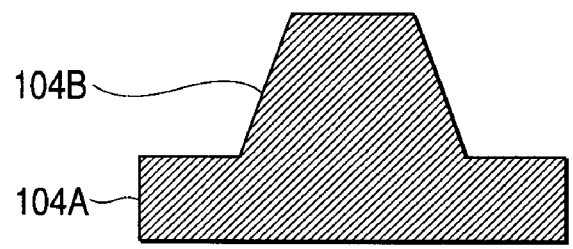
FIG. 4A is a view showing a method for manufacturing the semiconductor device of the first embodiment (part 14)

In a step shown in FIG. 3C, the bumps 104 are formed, on the respective electrode pads 103, from the bonding wire made of Au by use of; e.g., a wire bonder. FIG. 4A shows a schematic diagram of section C (the bumps 104) shown in FIG. 3C in an enlarged manner. The wire bonder continuously performs connection of the bonding wire to the electrode pads 103 and cutting of the connected bonding wire, thereby forming the bump main bodies 104A connected to the respective electrode pads 103 and the projection sections 104B projecting from the bump main bodies 104A.

Figure 3D:
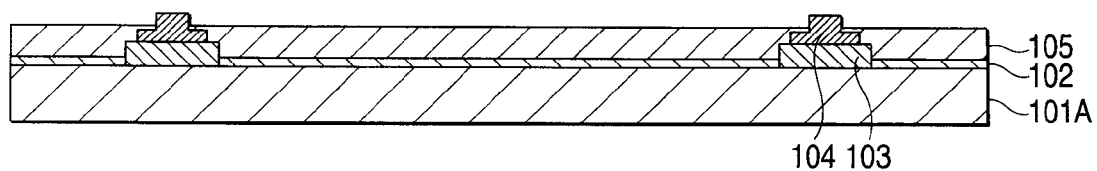
FIG. 3D is a view showing a method for manufacturing the semiconductor device of the first embodiment (part 4)

Next, in the step shown in FIG. 3D, the insulting layer 105 made from; e.g., an epoxy-based resin material, is formed on the substrate 101A (the protective layer 102). The insulating layer 105 is formed by means of; for example, lamination (affixing) or coating. The projection sections 104B of the bumps 104 are preferably formed so as to become exposed on the insulating layer 102. Therefore, for example, a soft resin material—which is called NCF and which is not substantially doped with a hardness adjustment material, such as a filler,—is preferably used as the insulating layer 105. Using the soft resin material facilitates uncovering of the projection sections 104B from the insulating layer 105.

The insulating layer 105 is not limited to the material mentioned above and can be formed by use of various insulation materials (resin materials). For instance, a build-up resin (a filler-containing epoxy resin), which is commonly used, or a resin material called ACF may also be used as the insulating layer 105.

Figure 3E:
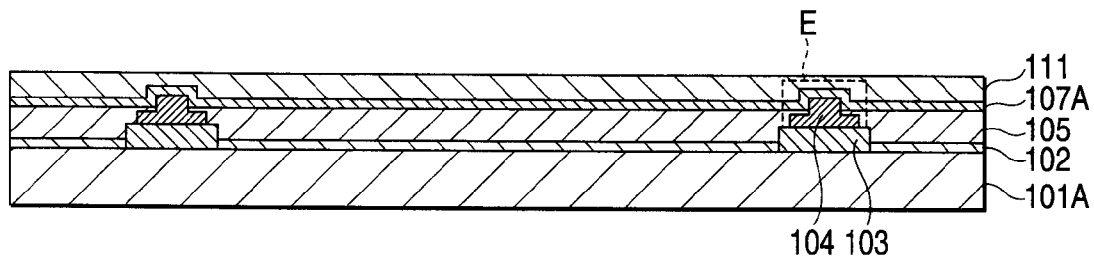
FIG. 3E is a view showing a method for manufacturing the semiconductor device of the first embodiment (part 5)

In a step shown in FIG. 3E, a conductive layer 107A made of; e.g. thin copper film, is affixed onto the insulating layer 105. For instance, the conductive layer 107A is affixed to the insulating layer 105 while being stacked on a supporting layer 111 made of Cu (i.e., while the conductive layer 107A is supported by the supporting layer 111).

Figure 4B:
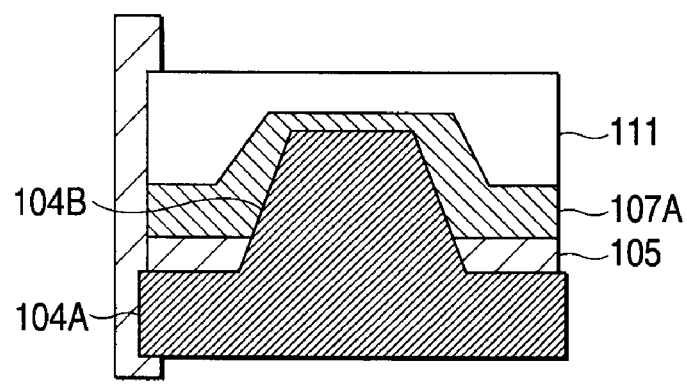
FIG. 4B is a view showing a method for manufacturing the semiconductor device of the first embodiment (part 15)

FIG. 4B shows a schematic diagram showing in an enlarged manner section E (a neighborhood of the bump 104) in FIG. 3E. In this step, the conductive layer 107A is bowed toward the supporting layer 111 so as to be pushed by the bump 104.

Figure 3F:
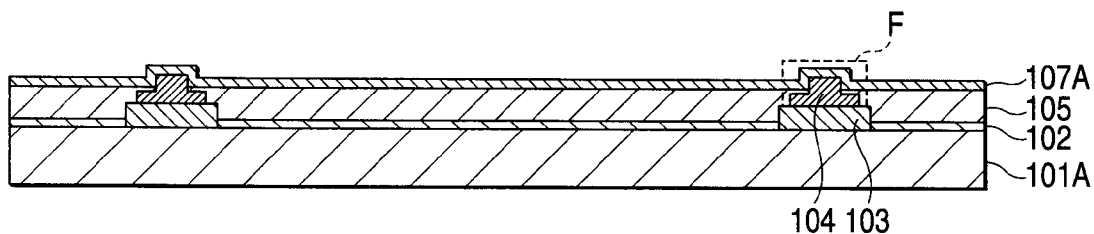
FIG. 3F is a view showing a method for manufacturing the semiconductor device of the first embodiment (part 6)
Figure 4C:
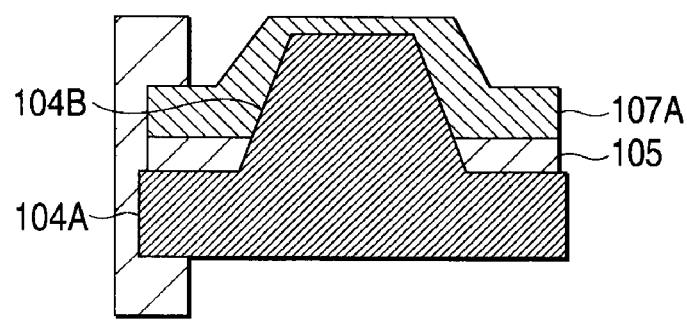
FIG. 4C is a view showing a method for manufacturing the semiconductor device of the first embodiment (part 16)

In a step shown in FIG. 3F, the supporting layer 111 supporting the conductive layer 107A is removed. FIG. 4C shows a schematic diagram showing, in an enlarged manner, section F (a neighborhood of the bump 104) in FIG. 3F.

Figure 3G:
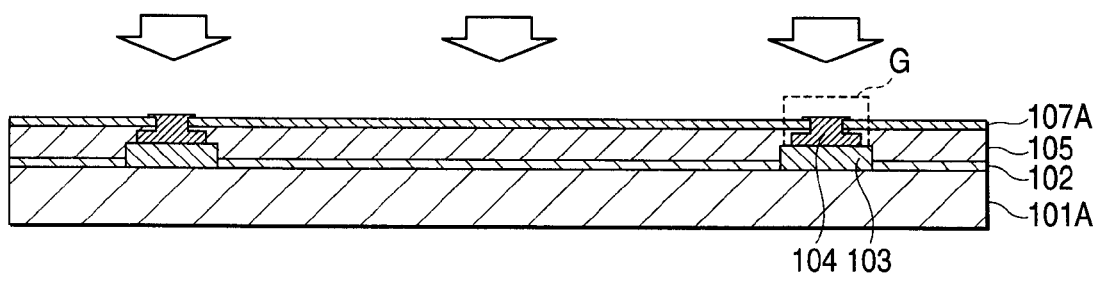
FIG. 3G is a view showing a method for manufacturing the semiconductor device of the first embodiment (part 7)
Figure 4D:
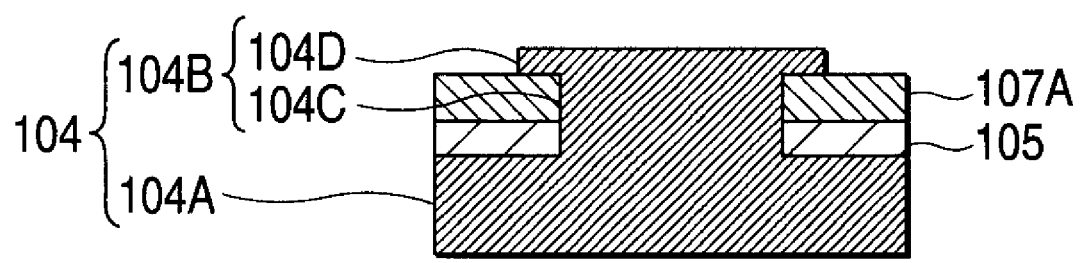
FIG. 4D is a view showing a method for manufacturing the semiconductor device of the first embodiment (part 17)

In step shown in FIG. 3G, the conductive layer 107A and the insulating layer 105, which are stacked one on top of the other, are pressed and heated. FIG. 4D shows a schematic diagram showing, in an enlarged manner, section G (a neighborhood of the bump 104) in FIG. 3G. In this step, the conductive layer 107A is first pushed, whereby the projection sections 104B of the bumps 104 penetrate through the conductive layer 107A. Thus, the extremities of the projection sections 104B are exposed. Further, the extremities of the exposed projections 104B are rolled into a flat shape by means of pressing. Therefore, the projection section 104B is formed from the flat extremity section 104D formed at the extremity of the projection section 104B and the connection section 104C located between the extremity section 104D and the bump main body 104A.

In this step, a contact area between the bumps 104 and the conductive layer 107A is increased, and the reliability of an electrical connection between the bumps 104 and the conductive layer 107A is assured. Moreover, in this step, the extremities of the projection sections 104B are rolled over the conductive layer 107A, and hence the reliability of an electrical connection between the bumps 104 and the conductive layer 107A is less liable to the influence of variations in the height of the bumps 104 (the projection sections 104B).

Therefore, a rewiring pattern exhibiting a superior reliability of connection can be formed, by means of a simple method by use of the bumps 104 which are formed by use of; e.g., bonding (bonding wires) and which have comparatively large variations in height. Under the above method, the abrasion step for uncovering the projection sections 104B of the bumps 104 from the insulating layer 105 is obviated.

The method for connecting the bumps 104 to the conductive layer 106 is characterized in that the method is simpler than a related-art connection method using brazing and that the method exhibits higher reliability of connection. Moreover, the conductive layer 106 is used as a feeding layer (a seed layer) in an electrolytic plating step to be described later.

In this step, the insulating layer 105 is pressed and heated along with the conductive layer 107A, to thus become cured (thermoset). Therefore, adhesion between the insulating layer 105 and the conductive layer 107A becomes superior.

Figure 3H:
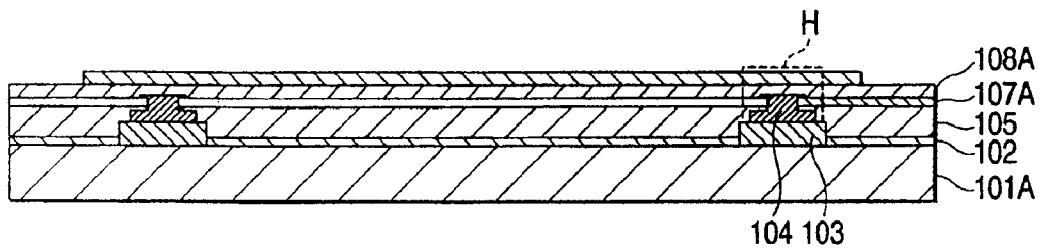
FIG. 3H is a view showing a method for manufacturing the semiconductor device of the first embodiment (part 8)
Figure 3I:
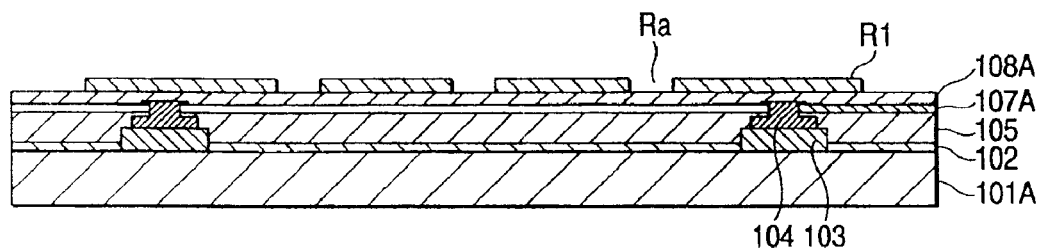
FIG. 3I is a view showing a method for manufacturing the semiconductor device of the first embodiment (part 9)
Figure 3J:
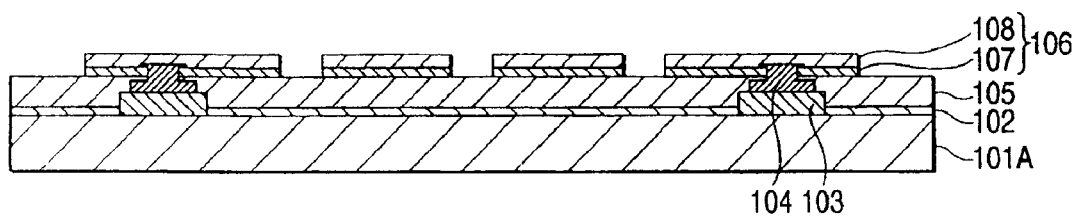
FIG. 3J is a view showing a method for manufacturing the semiconductor device of the first embodiment (part 10)

In step shown in FIGS. 3H to 3J, the conductive pattern 106 to be connected to the bumps 104 is formed by means of electrolytic plating during which the conductive layer 107A is used as a feeding layer (a seed layer). For instance, a subtraction method and a semi-additive method are available as a method for forming the conductive pattern 106. In the present embodiment, the subtraction method will be described. The subtraction method is a method for subjecting a conductive layer formed through plating to pattern etching, to thus form a conductive pattern. The semi-additive method is a method for forming a conductive pattern by means of pattern plating which uses a mask pattern.

Figure 4E:
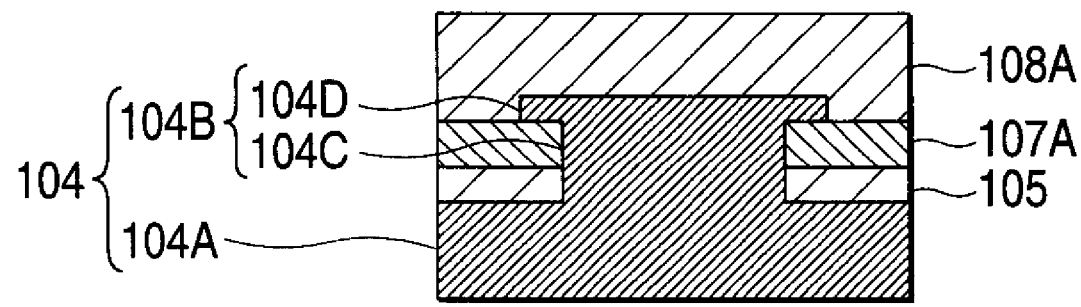
FIG. 4E is a view showing a method for manufacturing the semiconductor device of the first embodiment (part 18)

In a step shown in FIG. 3H, a conductive layer 108A made of; e.g., Cu, is stacked on the conductive layer 107A by means of electrolytic plating during which the conductive layer 107A is taken as a feeding layer. FIG. 4E shows a schematic diagram showing, in an enlarged manner, section H (a neighborhood of the bump 104) in FIG. 3H.

In this step, the conductive layer 107A and the flat extremity sections 104D exposed on the conductive layer 107A are covered with the conductive layer 108A formed through electrolytic plating. Specifically, the extremity sections 104D are sandwiched between the conductive layer 107A and the conductive layer 108A.

In a step shown in FIG. 3I, a mask pattern R1 having openings Ra is formed over the conductive layer 108A. The mask pattern R1 can be formed by means of formation of a resist layer performed through coating or affixing of a film and patterning of the resist layer performed through photolithography.

In step shown in FIG. 3J, the conductive layers 107A and 108A are subjected to pattern etching by means of taking the mask pattern R1 as a mask, whereby the conductive pattern 106—into which the first conductive layer 107 and the second conductive layer 108 are stacked and which is connected to the bumps 104—is formed.

For instance, the first conductive pattern 107 is formed to a thickness of 2 to 3 μm and the second conductive pattern 108 is formed to a thickness of 30 to 40 μm. However, these numerals are mere examples, and the present invention is not limited to these numerals.

The conductive layer 107A is taken as a feeding layer at the time of formation of the conductive pattern 106, thereby facilitating use of electrolytic plating.

For instance, when a feeding layer (a seed layer) is formed through electroless plating, processing for roughening the surface of an insulating layer (so-called desmear processing) is required, which in turn makes process for forming a plating layer complex. Moreover, when a feeding layer is formed through sputtering, an expensive film growth apparatus having a vacuum processing container is required, which adds to manufacturing cost.

In the meantime, the method of the present embodiment is characterized in that desmear processing and sputtering processing to be performed in a vacuum chamber become obviated and that a feeding layer (i.e., the conductive layer 107A) can be formed readily by means of a simple method. Therefore, the method for manufacturing the semiconductor device is made simple by the method of the present embodiment, and manufacturing cost is curtailed.

Figure 3K:
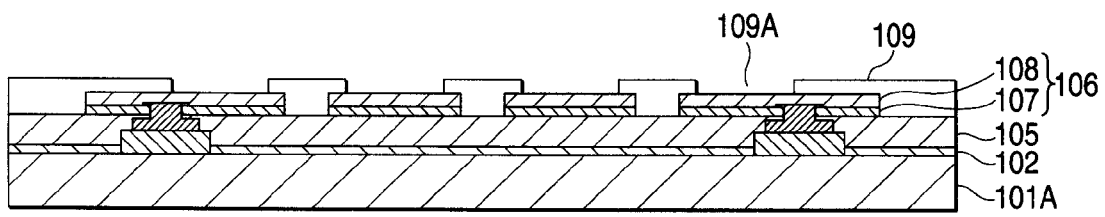
FIG. 3K is a view showing a method for manufacturing the semiconductor device of the first embodiment (part 11)

Next, in a step shown in FIG. 3K, after the surface of the conductive pattern 106 (Cu) has been roughened, as required, a solder resist layer (an insulating layer) 109 having openings 109A is formed over the insulating layer 105. Portions of the conductive pattern 106 become exposed through the openings 109A.

Figure 3L:
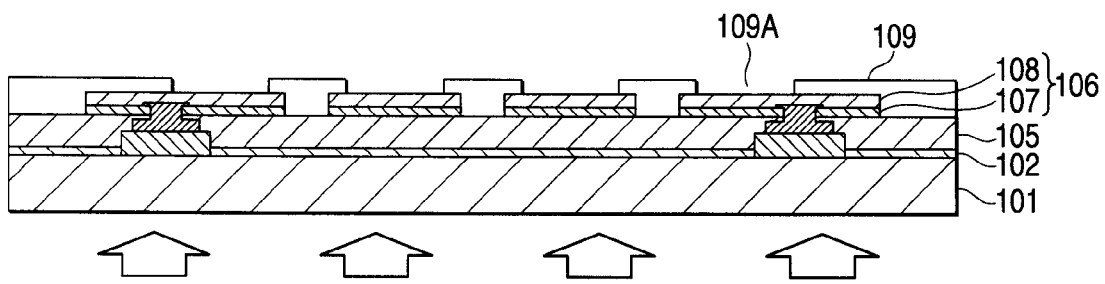
FIG. 3L is a view showing a method for manufacturing the semiconductor device of the first embodiment (part 12)

In a step shown in FIG. 3L, the back of the substrate 101A is abraded, as necessary, to a predetermined thickness.

Figure 3M:
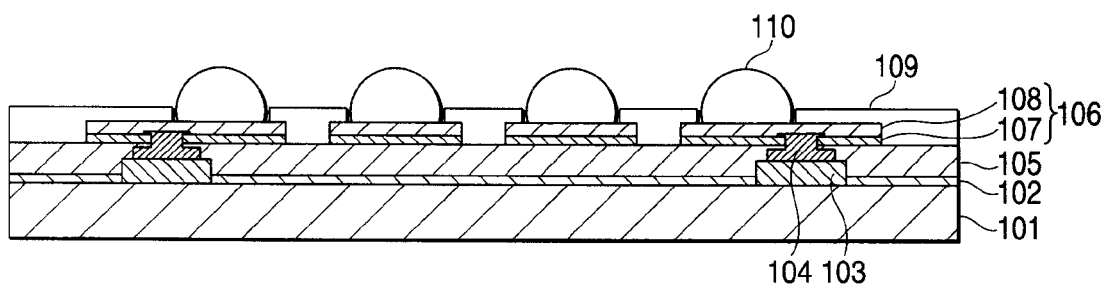
FIG. 3M is a view showing a method for manufacturing the semiconductor device of the first embodiment (part 13)

Next, in a step shown in FIG. 3M, solder bumps 110 are formed on the portions of the conductive pattern 106 exposed through the openings 109A, as required. Moreover, the substrate 101A is diced, to thus separate the semiconductor chip into pieces. Thus, the semiconductor devices 100 previously described by reference to FIGS. 1 and 2 can be manufactured.

Figure 5:
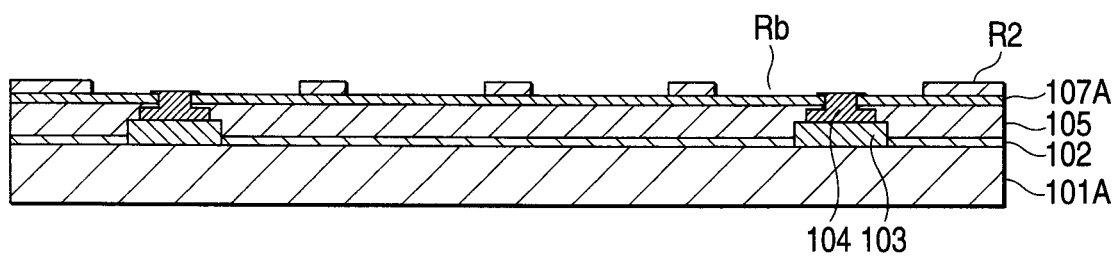
FIG. 5 is a view showing a modification of the method for manufacturing the semiconductor device of the first embodiment (part 1)

Under the above manufacturing method, the conductive pattern 106 is formed by means of the subtraction method. However, the conductive pattern 106 may also be formed by use of the semi-additive method. In this case, the essential requirement is to perform; for example, processing pertaining to steps, which will be described below, in lieu of processing pertaining to the steps shown in FIGS. 3H to 3J after processing pertaining to the steps shown in FIGS. 3A to 3G has been performed under the manufacturing method. For instance, as shown in FIG. 5, a mask pattern R2 having openings Rb is formed over the conductive layer 107A. The mask pattern R2 can be formed by means of formation of a resist layer performed through coating or affixing of a film and patterning of the resist layer performed through photolithography.

Next, a second conductive pattern is formed over the portions of the conductive layer 107A exposed through the openings Rb by means of electrolytic plating during which the conductive layer 107A is taken as a feeding layer (a seed layer). After plating of the pattern, the mask pattern R2 is exfoliated. Further, the excessive feeding layer 107A which is exposed as a result of exfoliation of the mask pattern R2 is etched away. As a result, the conductive pattern 106 shown in FIG. 3J can be formed.

Under the manufacturing method, in steps shown in FIGS. 3D and 3E, the conductive layer 107A is affixed onto the insulating layer 105 after formation of the insulating layer 105 on the substrate 101A. However, a layer into which the insulating layer 105 and the conductive layer 107A have been stacked previously may also be affixed to the substrate 101A.

Figure 6:
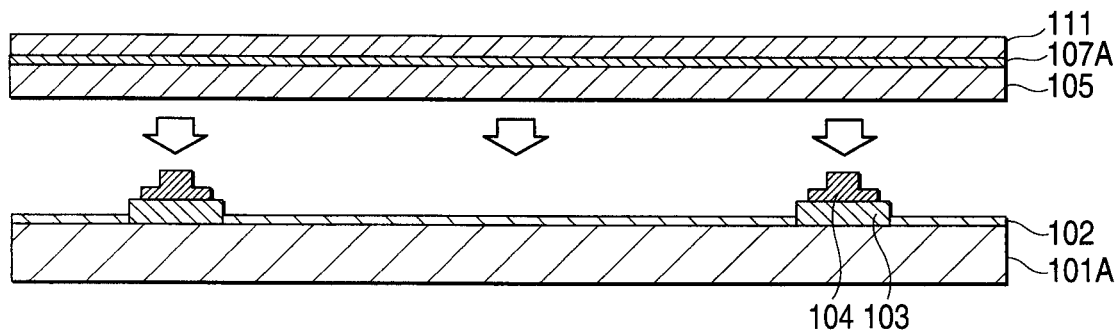
FIG. 6 is a view showing a modification of the method for manufacturing the semiconductor device of the first embodiment (part 2).

In this case, the essential requirement is to perform processing pertaining to steps, which will be described below, in place of processing pertaining to steps shown in FIGS. 3D and 3E, after performance of processing pertaining to steps shown in FIGS. 3A to 3C under the above manufacturing method. For instance, as shown in FIG. 6, the insulating layer 105 and the conductive layer 107A which are stacked on the supporting layer 111 may also be affixed to the substrate 101A.

Subsequently, processing pertaining to the previously-described step shown in FIG. 3F and subsequent steps is practiced, whereby the semiconductor devices 100 can be manufactured.

The present invention has been described in connection with the preferred embodiment thus far. However, the present invention is not limited to the above specific embodiment and susceptible to various modifications or alterations within the scope of the gist defined by the claims appended hereto.

The present invention enables provision of a highly-reliable semiconductor device which can be manufactured at low cost and a method for manufacturing the semiconductor device.

What is claimed is:

1. A semiconductor device comprising:

a semiconductor chip on which electrode pads are formed;

bumps which are formed on and connected to respective electrode pads and which have projection sections;

an insulating layer formed on the semiconductor chip; and a conductive pattern, which is connected to the bumps, is formed on the insulating layer, the conductive pattern including a first conductive pattern and a second conductive pattern stacked on the first conductive pattern, wherein extremities of the projection sections are formed on the first conductive pattern, and the second conductive pattern is formed on the extremities, and the extremities are flattened between the first conductive pattern and the second conductive pattern.

* * * * *